(12) United States Patent
Fukiage

(10) Patent No.: US 8,094,512 B2
(45) Date of Patent: Jan. 10, 2012

(54) SEMICONDUCTOR MEMORY DEVICE WITH INDIVIDUAL AND SELECTIVE REFRESH OF DATA STORAGE BANKS

(75) Inventor: Takahiko Fukiage, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 187 days.

(21) Appl. No.: 12/685,245

(22) Filed: Jan. 11, 2010

(65) Prior Publication Data
US 2010/0182863 A1    Jul. 22, 2010

(30) Foreign Application Priority Data
Jan. 20, 2009  (JP) ................................ 2009-010249

(51) Int. Cl.
*G11C 7/00*    (2006.01)
(52) U.S. Cl. .............. 365/222; 365/230.03; 365/189.05; 365/193
(58) Field of Classification Search ............. 365/230.03, 365/222, 189.05, 193, 191, 230.08
See application file for complete search history.

(56) References Cited

U.S. PATENT DOCUMENTS 5,995,434 A * 11/1999 Ryu ............................... 365/222
6,137,743 A * 10/2000 Kim ............................... 365/222
6,381,188 B1    4/2002 Choi et al.
6,944,708 B2 *  9/2005 Frame et al. .................. 711/106

FOREIGN PATENT DOCUMENTS

JP    2000-215665 A    8/2000
JP    2004-227624 A    8/2004

* cited by examiner

*Primary Examiner* — Andrew Q Tran
(74) *Attorney, Agent, or Firm* — Sughrue Mion, PLLC

(57) ABSTRACT

A conventional semiconductor memory device may be in need of a special refresh sequence if it is desired to reduce the current consumption in connection with a refresh operation. With this in view, there is disclosed a semiconductor memory device 1 that has a recording area 30 formed by a plurality of memory banks 31 to 3n. The refreshing operation for this semiconductor memory device 1 may be performed on the memory bank basis. The semiconductor memory device 1 includes refresh control circuits 21 to 2n and holding circuits 11 to 1n in association individually with the memory banks 31 to 3n. The holding circuits 11 to 1n are set when data has been written in associated ones of the memory banks 31 to 3n following resetting of the semiconductor memory device. The refresh control circuits 21 to 2n set the associated memory banks 31 to 3n to a refresh enabling state in case the associated holding circuits 11 to 1n are in a set state (FIG. 1).

20 Claims, 5 Drawing Sheets

SEMICONDUCTOR MEMORY DEVICE WITH INDIVIDUAL AND SELECTIVE REFRESH OF DATA STORAGE BANKS

REFERENCE TO RELATED APPLICATION

This application is based upon and claims the benefit of the priority of Japanese patent application No. 2009-010249, filed on Jan. 20, 2009, the disclosure of which is incorporated herein in its entirety by reference thereto.

This invention relates to a semiconductor memory device and, more particularly, to a semiconductor memory device having a refresh function to update the stored information to retain the information.

BACKGROUND

Technical Field

A DRAM is used as a large capacity semiconductor memory in a variety of electronic devices. A basic memory cell of a DRAM is made up of a sole transistor and a sole capacitance element, with the capacitance element operating to store and hold data. Hence, data stored in the capacitance element may be lost by current leakage. The DRAM thus has a refresh function of periodically re-storing electrical charges in the capacitance element to prevent data from being lost.

In the DRAM, having such refresh function, the current consumption in the DRAM increases. Patent Document 1 discloses a semiconductor memory device that is able to accurately perform a refresh operation on a subject in need of the refresh operation. In this semiconductor memory device, a command signal for performing a refresh operation on a fraction of memory elements that is to be refreshed is generated, so that the refresh operation is carried out by the command signal on that fraction of the memory elements which is to be refreshed. More specifically, a self-refresh mode register set command is added in advance of executing a self-refresh command in order to set an area in which to perform self-refresh beforehand in a register.

On the other hand, the memory area of a DRAM is divided into a plurality of memory banks, and a preset amount of data is entered on the memory bank basis, in order to cope with the DRAM's increasing storage capacity. For such DRAM, Patent Document 2 discloses a dynamic memory device having a refresh control circuit that designates one or a plurality of memory banks to perform refresh on the so designated memory bank or banks.

[Patent Document 1]
JP Patent Kokai Publication No. JP-P2004-227624A
[Patent Document 2]
JP Patent Kokai Publication No. JP-P2000-215665A

SUMMARY

The entire disclosures of Patent Documents 1 and 2 are incorporated herein by reference thereto.

The following analysis is given from the view of the present invention.

In keeping with a highly advanced and diversified function of a mobile electronic device, the storage capacity of a DRAM has increased. Hence, there is an increasing demand for reducing the current consumption for the DRAM. The technique of Patent Document 1 is effective if such demand is to be met. It is however necessary to enter a self-refresh mode register set command, a special command, in order to apply the refresh operation. As a consequence, the compatibility with general-purpose DRAMs is lost, thus detracting from versatility of component parts in designing the electronic devices.

On the other hand, in the dynamic memory device, disclosed in Patent Document 2, it is necessary to specify one or more memory banks to perform refresh. Hence, a special refresh sequence is required to reduce the current consumption, thus detracting from universality in connection with the usage of the semiconductor memory device.

In a first aspect of the present invention, there is provided a semiconductor memory device capable of performing a refresh operation of updating the recorded information in order to retain the information. The semiconductor memory device comprises: a plurality of memory banks, each formed by a recording area constituted by a preset number of bits, and a command generation circuit that accepts a command from outside for individually accessing the memory banks. The semiconductor memory device also comprises a plurality of refresh control circuits that independently perform refresh operation on the memory bank basis. Each refresh control circuit exercises control to enable the refresh operation to be executed based on a first record (output from a holding circuit) which indicates that the command generation circuit has accessed a relevant one of the memory banks from outside.

In a second aspect of the present invention, there is provided a semiconductor memory device capable of performing a refresh operation of updating the recorded information in order to retain the information. The semiconductor memory device comprises a plurality of memory banks, each formed by a recording area constituted by a preset number of bits, and a plurality of refresh control circuits that are individually associated with the memory banks and that independently perform refresh operation on the memory bank basis. The semiconductor memory device also comprises a plurality of holding circuits that are individually associated with the memory banks. The holding circuits are reset in case the semiconductor memory device is reset. The holding circuits are set in case data has been written from outside in associated ones of the memory banks. The refresh control circuits control associated ones of the memory banks to a refresh operation enabling state in case associated ones of the holding circuits are in a set state.

In a third aspect of the present invention, there is provided a semiconductor memory device a recording area of which is formed by a plurality of memory banks and which may be refreshed on the memory bank basis. The semiconductor memory device comprises: a refresh control circuit and a holding circuit in association with each of the memory banks. The holding circuit is set if, after resetting the semiconductor memory device, data has been written from outside in a relevant one of the memory banks. The refresh control circuit controls the relevant memory bank to a refresh operation enabling state in case the holding circuit is in a set state.

The meritorious effects of the present invention are summarized as follows.

According to the present invention, only the memory bank (s) in which data has been written after the resetting may automatically be refreshed. Hence, no special refresh sequence is necessary to reduce the current consumption in connection with the refreshing operation, thus improving the universality in connection with the usage of the semiconductor memory device.

PREFERRED MODES

Figure 1:
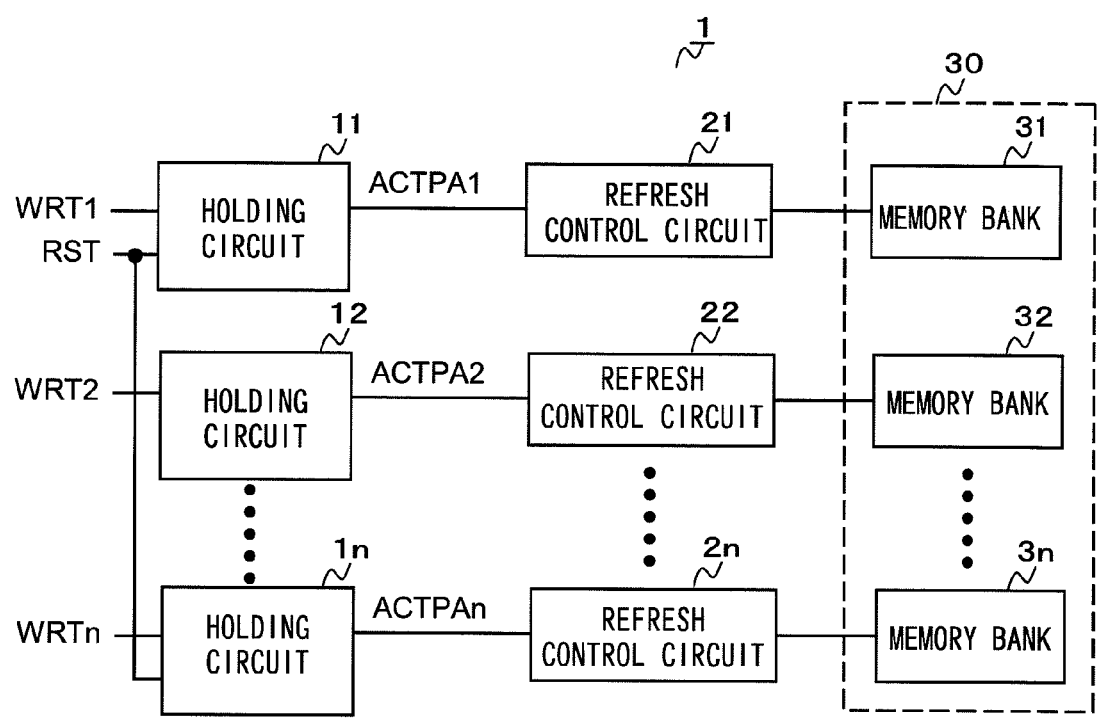
FIG. 1 is a block diagram showing the configuration of a semiconductor memory device according to a mode of the present invention.

FIG. 1 shows the configuration of a semiconductor memory device according to an exemplary embodiment of the present invention. Referring to FIG. 1, a storage area 30 of a semiconductor memory device 1 is formed by a plurality of memory banks 31 to 3n, and a refresh operation may be carried out on the memory bank basis (i.e., memory bank by memory bank). The semiconductor memory device 1 includes a plurality of refresh control circuits 21 to 2n and a plurality of holding circuits 11 to 1n, in association with the memory banks 31 to 3n, respectively. One or more of the holding circuits 11 to 1n are set if, after the semiconductor memory device 1 has been reset, that is, after a reset signal RST is activated, data has been written in one or more of the memory banks 31 to 3n associated with the holding circuits, that is, if control signals WRT1 to WRTn, which are bank write command pulse signals, are activated. One or more of the refresh control circuits 21 to 2n set the associated one or more of the memory banks 31 to 3n to a state readied for a refresh operation in case the associated one or more of the holding circuits 11 to 1n are set. Each holding circuit is thus a circuit that holds a record indicating that a command generation circuit, as later explained, has accessed a relevant memory bank from outside (first record). It should be noted that, in the present Exemplary Embodiment 1, each memory bank is a unit capable of individually accepting a command from outside. Each of the multiple memory banks is non-exclusive in the sense that these memory banks may respectively be set into active operation at the same time. For example, word lines WL or bit lines BL of a memory cell array in the memory bank 31 and those of a memory cell array in the memory bank 32 may individually be accessed from outside at the same time period by respective different commands. For example, the memory bank 32 may be controlled to an active state, that is, its word and bit lines may be maintained in active states, at the same time as the memory bank 31 is kept in its active state. It should be noted however that a plurality of external terminals, such as control terminals or I/O terminals, of a semiconductor memory device, are shared by the memory banks of the semiconductor memory device irrespective of the number of the memory banks.

A plurality of write command pulse generation circuits (41 to 4n of FIG. 2) may respectively be provided in association with the memory banks 31 to 3n. The write command pulse generation circuits each output a pulse signal that sets an associated one of the holding circuits 11 to 1n if, after activation of an active command, a write command is activated.

The write command pulse generation circuits may each output a pulse signal that sets a relevant one of the holding circuits 11 to 1n in synchronism with a first memory bank designation signal generated on the basis of bank address signals.

The write command pulse generation circuit may include a latch circuit that latches an active signal, generated on the basis of activation of an active command, in synchronism with a second memory bank designation signal generated on the basis of the bank address signals.

The above refresh may be self refresh or an auto refresh.

With the above mentioned semiconductor memory device 1, described above, the information on the bank, for which data has been written after resetting, is held, and only the memory bank, for which the data has been written, is automatically refreshed during the refresh operation. Hence, no refresh sequence is needed, thus reducing the current consumption in connection with the refresh operation. There is thus imposed no particular restriction on the sorts of the semiconductor memory devices that may be used.

It should be noted that the circuit related to the read/write operations, which are customary operations of DRAMs, is omitted because such circuit is not related with the subject-matter itself of the present invention. The present invention will now be described in more detail with reference to Exemplary Embodiment 1.

Exemplary Embodiment 1

Figure 2:
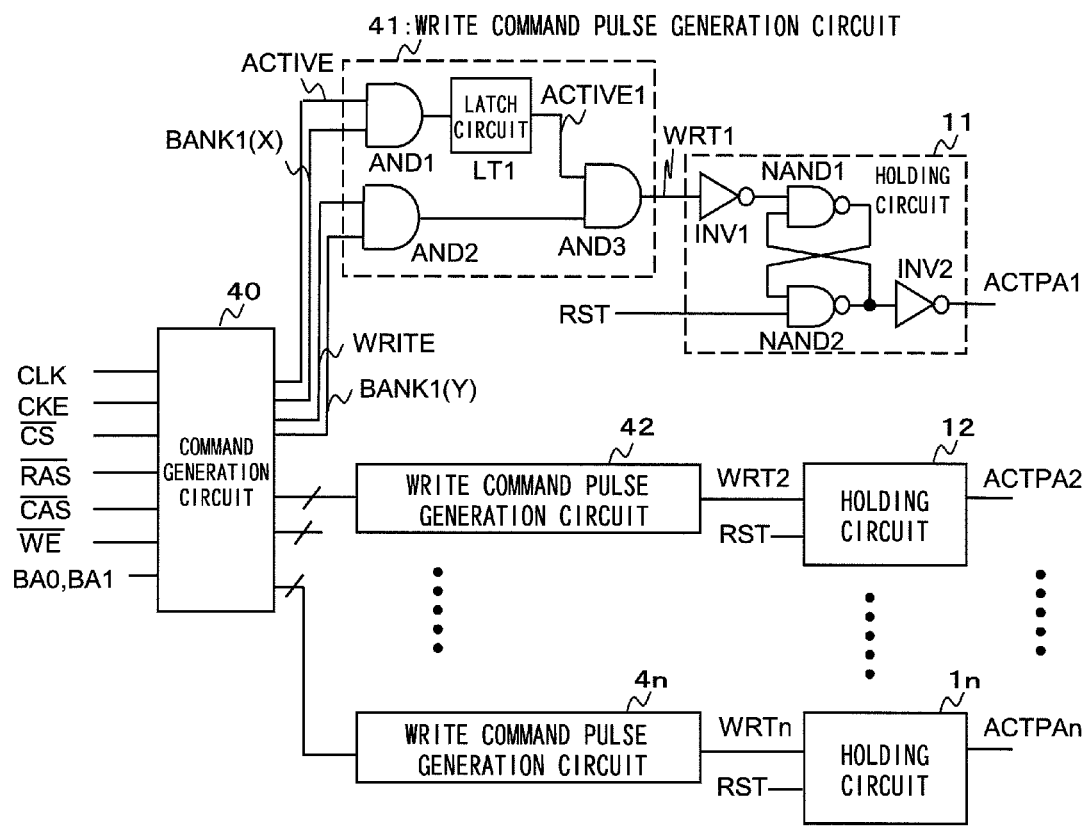
FIG. 2 is a block diagram showing the configuration of a first main portion of a semiconductor memory device of Exemplary Embodiment 1 of the present invention.

FIG. 2 shows a configuration of a first main portion of the semiconductor memory device of Exemplary Embodiment 1 of the present invention. In the first main portion, shown in FIG. 2, the holding circuits 11 to 1n are controlled by a plurality of external control signals. The first main portion includes a command generation circuit 40, a plurality of write command pulse generation circuits 41 to 4n and a plurality of holding circuits 11 to 1n.

As in a routine DRAM, the command generation circuit 40 inputs, from outside the semiconductor memory device 1, a clock signal CLK, a clock enable signal CKE, a chip select signal /CS, a row address strobe signal /RAS, a column address strobe signal /CAS, a write enable signal /WE and bank address signals BA0, BA1. The command generation circuit 40 decodes these input signals to output a signal related to an active command ACTIVE, memory bank selection signals BANKi(X) and BANKi(Y), where i=1 through n, and a signal related to a write command WRITE to the write command pulse generation circuits 4i associated with the designated memory bank. It should be noted that the signal related to the active command ACTIVE, the memory bank selection signals BANKi(X), BANKi(Y) and the signal related to the write command WRITE are termed below an active command signal ACTIVE, memory bank designation signals BANKi(X), BANKi(Y) and a write command signal WRITE, respectively.

The write command pulse generation circuit 4i includes AND circuits AND1 to AND3 and a latch circuit LT1. The AND circuit AND1 finds a logical product of the active command ACTIVE and the memory bank designation signal BANKi(X) to output the result to the latch circuit LT1. The AND circuit AND2 finds a logical product of the write command signal WRITE and the memory bank designation signal BANKi(Y) to output the result to one input of an AND circuit AND3. The AND circuit AND3 inputs at its other input the signal ACTIVEi, as output from the latch circuit LT1, and finds a logical product of the signal ACTIVEi and the output signal of the AND circuit AND2 to output the result as a control signal WRTi to the holding circuit 1i. In short, the latch circuit LT1 operates to hold a record (a second record) indicating that it has recognized the active command from outside that commands reading out the information stored in the associated memory bank to a sense amplifier.

The holding circuit 1i includes inverter circuits INV1, INV2 and NAND circuits NAND1, NAND2. The inverter circuit INV1 inverts the logic state of the control signal WRTi to output the resulting signal to one input of the NAND circuit NAND1. The NAND circuit NAND1 has its other input connected to an output of the NAND circuit NAND2, while having its output connected to one input of the NAND circuit NAND2. The NAND circuit NAND1 thus forms an RS flip-flop circuit along with the NAND circuit NAND2. A reset signal RST is entered to the other input of the NAND circuit NAND2. An output of the NAND circuit NAND2 is entered as a control signal ACTPAi via the inverter circuit INV2 to the refresh control circuits 2i.

Figure 3:
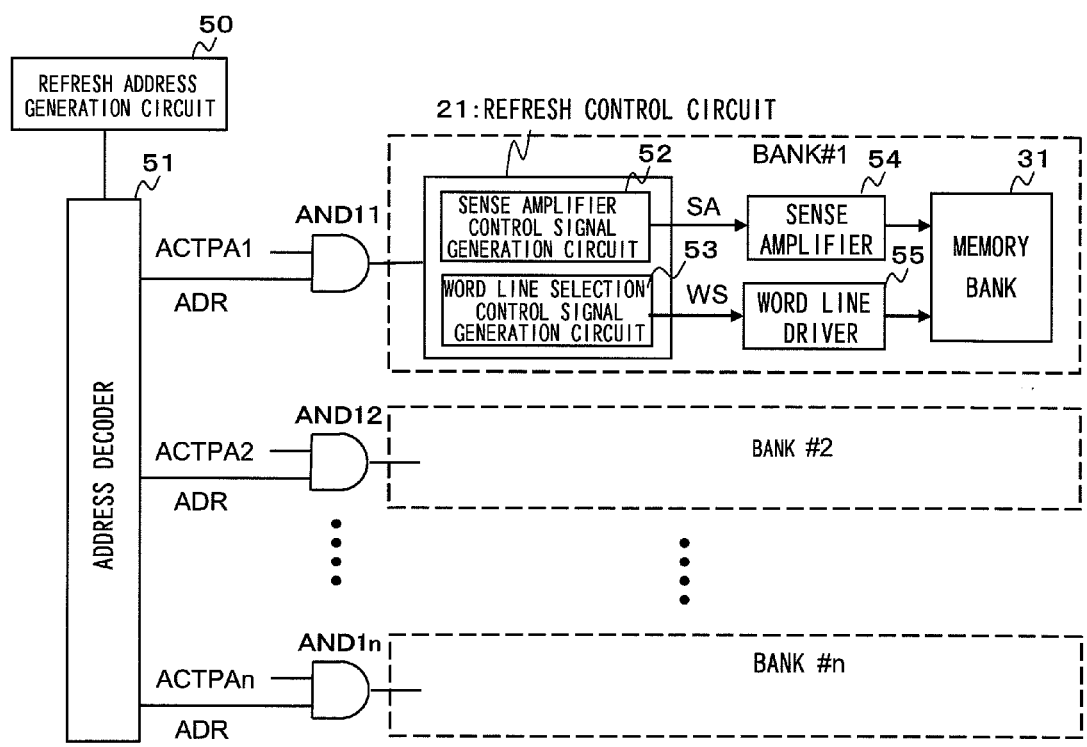
FIG. 3 is a block diagram showing the configuration of a second main portion of a semiconductor memory device of Exemplary Embodiment 1 of the present invention.

FIG. 3 shows the configuration of a second main portion of a semiconductor memory device according to Exemplary Embodiment 1 of the present invention. The second main portion, shown in FIG. 3, forms a portion of the semiconductor memory device related to refresh control of the memory bank 3i in the bank #i that has input the control signal ACTPAi. The second main portion includes a refresh address generation circuit 50, an address decoder 51, an AND circuit AND1i and the bank #i. The AND circuit AND1i, the refresh control circuit 21, a sense amplifier 54, a word line driver 55 and the memory bank 3i are provided on the memory bank basis in association with each of the memory banks #1 to #n. The refresh control circuit 21 includes a sense amplifier control circuit 52 and a word line selection signal generation circuit 53. Meanwhile, FIGS. 2 and 3 show only the configuration related to refresh, and the circuit related to customary read/write operations is omitted. In the foregoing, i=1 through n. The sense amplifier 54 and the word line driver 55 are controlled in the customary read/write operation. A memory cell, a well-known 1-bit memory element, is connected to a word line and to a bit line. An output terminal of a word line driver 55 is connected to the word line, and the sense amplifier 54 is connected to the bit line. The word line associated with the first address (row address) is activated by the active command entered from outside. The memory cell is connected to the bit line. The sense amplifier 54 is connected to an I/O circuit, not shown, by a read command supplied from outside, so that the information on the memory cell is output to outside. The sense amplifier 54 is connected to the I/O circuit, not shown, by a write command, entered from outside, so that write data from outside is written via the sense amplifier in the memory cell.

The refresh address generation circuit 50 has a function of generating refresh period and a function of counting inner addresses, and outputs address signals for refresh to the address decoder 51. The address decoder 51 outputs a signal ADR, decoded from the address signal, to one input of the AND circuit AND1i, the other input of which inputs the control signal ACTPAi. The AND circuit AND1i finds a logical product of the control signal ACTPAi and the signal ADR to output the result to the refresh control circuit 21. In short, the signal ADR, associated with each of a plurality of the memory banks, is a refresh execution signal to each of these memory banks. In more detail, data is written in e.g., two banks, specifically, in the memory bank 31 and in the memory bank 3n, as later explained. During refresh, two decoded signals ADR are supplied to the refresh control circuit 21 of the bank #1 and to the refresh control circuit 2n of the bank #n in parallel, so that refresh operations are carried out for the word lines of the memory banks 31, 3n in parallel. Hence, those skilled in the art will readily realize that the signal ADR, which is the decoded address signal, is not related to the function of simply decoding each of the multiple address signals, but is a refresh execution signal or a refresh request signal for each of the memory banks. It should be noted that the function of generating the refresh period is valid at the time of the self-refresh operation and the refresh period is issued within the inside of the semiconductor memory device at a preset period after a command for entry to self-refresh has been delivered from outside. The refresh request signal ADR of the preset period is an internal signal asynchronous with respect to outside. The refresh request signal ADR is generated, at the time of the self refresh, based on the refresh period generation function, while being generated, at the time of auto-refresh, by the command generation circuit 40 that has recognized an auto-refresh command from outside.

In case the control signal ACTPAi has been activated by data write in the memory bank 3i, the signal ADR (refresh execution signal), decoded from the address signal, is entered to the refresh control circuit 21, via the AND circuit AND1i, in the course of a subsequent refresh operation for the memory bank 3i. At this time, the sense amplifier control circuit 52 and the word line selection signal generation circuit 53 of the refresh control circuit 21 control the sense amplifier 54 and the word line driver 55 to execute a refresh operation for memory cells (re-storing of charges for the capacitance elements). This refresh operation is carried out from per one word line of the memory bank 3i (to another) based on a change (count-up) of the refresh address generated by the refresh address generation circuit 50. The foregoing applies for each of the banks #1 to #n.

The refresh is either the self-refresh or the auto-refresh.

In self-refresh, when a self-refresh start command is entered to the command generation circuit 40, an inner address counter in the refresh address generation circuit 50 automatically counts up based on the refresh period internally generated asynchronously with respect to outside. Responsive to this count-up, the word lines of the memory bank 3i are sequentially selected every refresh period to carry out refresh of memory cells of the memory bank 3i.

In auto-refresh, an inner address counter in the refresh address generation circuit 50 counts up each time an auto-refresh command is entered to the command generation circuit 40. Responsive to this count-up, word lines of the memory bank 3i are sequentially selected for each auto-refresh command to perform a refresh operation for the memory bank 3i.

In the above refresh, the control signal ACTPAi is activated for the memory bank 3i, for which data has been written, and the refresh operation is carried out for the memory bank 3i for which the control signal ACTPAi has been activated.

Figure 4:
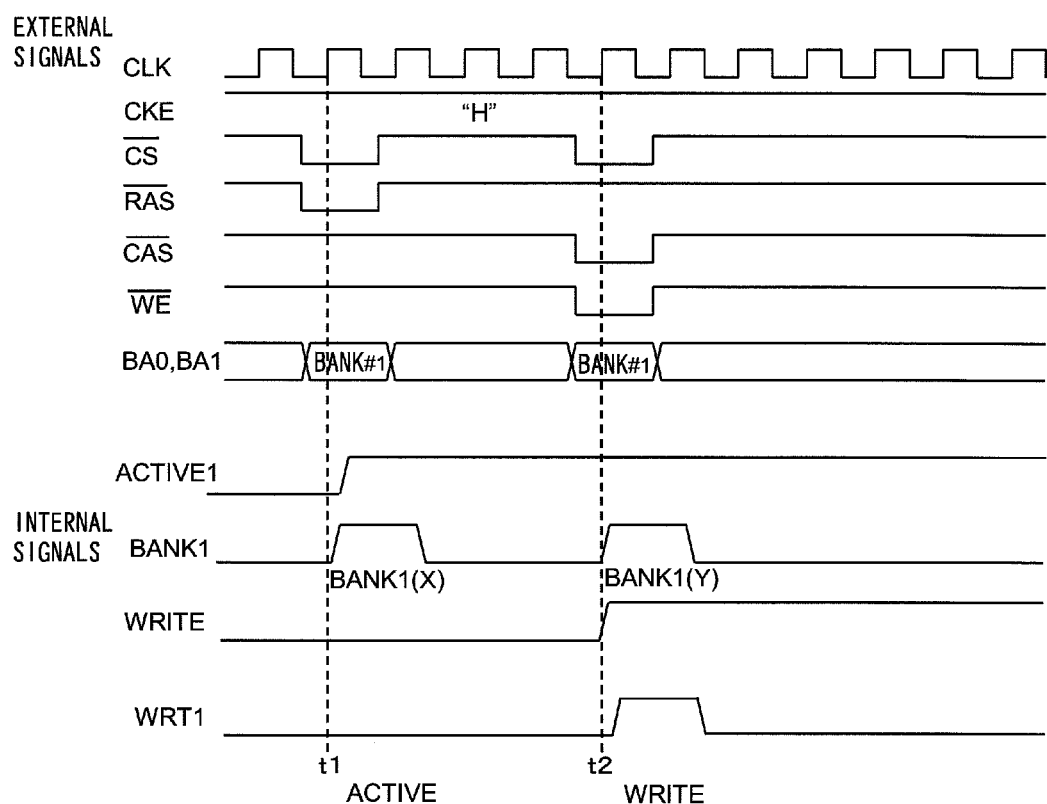
FIG. 4 is a first timing chart showing the operation of the semiconductor memory device of Exemplary Embodiment 1 of the present invention.

An operation, as an example, related to refresh of the semiconductor memory device according to Exemplary Embodiment 1 of the present invention will now be described. FIG. 4 is a first timing chart showing the operation of the semiconductor memory device of Exemplary Embodiment 1 of the present invention. It is now assumed that the bank #1 has been selected as a subject (target) for refresh. In the following description, the logic levels for "HIGH" and "LOW" are indicated as "H" and "L", respectively.

It is assumed that, at a timing t1 indicating the rise of the clock signal CLK, the clock enable signal CKE="H", the chip select signal /CS="L", the row address strobe signal /RAS="L", the column address strobe signal /CAS="H" and the write enable signal /WE="H". In this case, the command generation circuit 40 decides that an active command has been entered thereto from outside, and outputs "H" as an active command signal ACTIVE. On the other hand, the bank address signals BA0, BA1 are decoded so that the memory bank designation signal BANK1(X) of the bank #1 becomes "H" for a preset time period. That is, both the active command signal ACTIVE and the memory bank designation signal BANK1(X), entered to the write command pulse generation circuit 41, become "H" only for a preset time interval. The latch circuit LT1 latches "H", a logical product of the active command signal ACTIVE and the memory bank designation signal BANK1(X), and sets ACTIVE1, its output signal, to "H".

It is also assumed that, at a timing t2 indicating the rise of the clock signal CLK after four clocks as from timing t1, the clock enable signal CKE="H", the chip select signal /CS="L", the row address strobe signal /RAS="H", the column address strobe signal /CAS="L" and the write enable signal /WE="L". In this case, the command generation circuit 40 decides that an active command has been entered thereto from outside, and outputs "H" as a write command signal WRITE. On the other hand, the bank address signals BA0, BA1 are decoded so that the memory bank designation signal BANK1(Y) of the bank #1 becomes "H" for a preset time period. That is, both the active command signal WRITE and the memory bank designation signal BANK1(Y), entered to the write command pulse generation circuit 41, become "H" only for a preset time interval. Hence, the signal WRT1, a logical product of the signal ACTIVE1 and a logical product of the write command WRITE and the memory bank designation signal BANK1(Y), becomes "H" for a preset time interval.

It should be noted that the memory bank designation signal BANK1(X) becomes "H" for a preset time interval in synchronism with the active command, while the memory bank designation signal BANK1(Y) becomes "H" for a preset time interval in synchronism with the write command. Both designation signals designate the bank #1 (memory bank 31).

Figure 5:
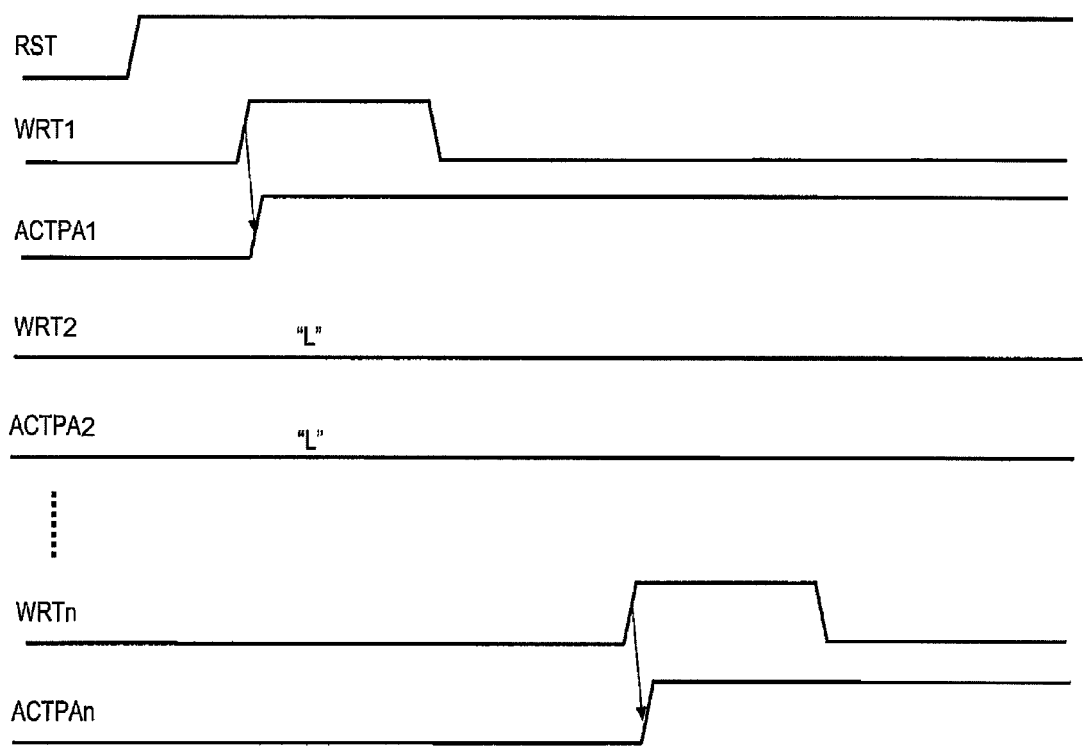
FIG. 5 is a second timing chart showing the operation of the semiconductor memory device of Exemplary Embodiment 1 of the present invention.

The operation subsequent to the holding circuit 11 will now be described. FIG. 5 depicts a second timing chart for illustrating an operation of the semiconductor memory device of Exemplary Embodiment 1 of the present invention.

If, in FIG. 5, the reset signal RST becomes "L" during a certain time interval due to, for example, power on resetting at the time of power up of the semiconductor memory device 1, the refresh activation signals ACTPA1 to ACTPAn of the respective banks, as output signals of the holding circuits 11 to 1n, are held at "L" even if the reset signal RST goes to "H" later on to cancel the reset state. Meanwhile, as long as the reset signal RST is at "L", WRT1 to WRTn, the other inputs of the holding circuits 11 to 1n, are controlled to become "L" (with an input to the NAND circuit NAND1 being at "H"). Among the trigger factors that generate the reset signal RST, there are a hardware resetting and software resetting of the semiconductor memory device. The hardware resetting initializes the semiconductor memory device in its entirety, while the software resetting initializes a portion of the functions of the semiconductor memory device.

In the state of the reset signal RST="H", following the resetting, data is written in the memory bank 31 by the above mentioned write command. The signal WRT1 is activated (goes to "H") during a preset time interval. With the signal WRT1 thus going to the level "H", the refresh activation signal ACTPA1, an output of the holding circuit 11, is inverted and transfers to an "H" state. With the refresh activation signal ACTPA1 kept at "H", the refresh control circuit 21 is enabled to perform a refresh operation for the memory bank 31 of the bank #1.

On the other hand, since no data has been written in the memory bank 32, an output signal WRT2 of a write command pulse generation circuit 42 is kept in its "L" state. Hence, the holding circuit 12 is kept in its reset state. The refresh activation signal ACTPA2 is kept in its "L" state. Hence, the output of the AND circuit AND12 goes to "L", thus disabling execution of the refresh operation for the memory bank 32 of the bank #2. The refresh operation for the memory bank 32 is disabled because it is unnecessary to perform the refresh operation for the memory bank 32 where no data is written. It is thus possible to reduce the number of the memory banks to be refreshed and hence to reduce the current consumption accompanying the refresh operation.

The same may be said of the banks #3 to #n. Depending on whether or not data has been written in the memory banks 33 to 3n, the logic level of any one of the refresh activation signals ACTPA3 to n, associated with the memory banks, may become "H", thus enabling the execution of the refresh operation, or may become "L", thus disabling execution of the refresh operation.

Meanwhile, FIG. 5 shows an exemplary case where data has been written in the memory banks 31 to 3n, with the logic levels of the refresh activation signals ACTPA1 and ACTPAn becoming "H" to enable the refresh operation for the memory banks 31 and 3n.

As mentioned above, the holding circuit 1i holds the information of the bank in which data has been written after resetting, and outputs the refresh activation signal ACTPAi as "H". During the course of the subsequent refresh operation, the refresh control circuit 2i decides that the data has been written in the memory bank 3i in case the refresh activation signal ACTPAi is active ("H"). The refresh control circuit then exercises control to automatically refresh the memory bank 3i. Specifically, during the refresh operation, the refresh address, generated by the refresh address generation circuit 50, is decoded by the address decoder 51, as shown in FIG. 3. The signal ADR, resulting from the decoding, is routed only to the refresh control circuit 2i of the bank where the refresh activation signal ACTPAi is active ("H"). Based on the decoded signal ADR, the sense amplifier control circuit 52 and the word line selection signal generation circuit 53 control the sense amplifier 54 and the word line driver 55 to refresh the memory cells from one word line of the memory bank 3i to another.

Meanwhile, in case data has been written in two memory banks, namely the memory bank 31 and the memory bank 3n, with the refresh activation signals ACTPA1 and ACTPAn being "H", as shown in FIG. 5, it is possible to perform the following operations:

Thus, during self-refresh, the decoded signals ADR are entered to the refresh control circuit 21 of the bank #1 and to the refresh control circuit 2n of the bank #n in parallel so that the refresh operation for the word lines of the memory bank 31 and that for the word lines of the memory bank 3n will be performed in parallel. Also, the input timing of the decoded signal ADR may be controlled to enable the refresh operations for the memory banks 31 and 3n to be performed sequentially to reduce the peak current of the power supply during refresh.

Moreover, during auto-refresh, it is a generally accepted practice to control the input timing of the decoded signal ADR in order to separately perform the refresh operation for the memory bank 31 and that for the memory bank 3n at respective different timings.

With the configuration of the present invention, described above, it is unnecessary to perform special refresh sequences related to refresh. Since the refresh operation is not performed for the memory banks in which no data has been written, it becomes possible to reduce the current consumption.

The present invention may be applied to a variety of semiconductor memory devices. The refresh operation that updates the recorded information to maintain the information is useful for non-volatile memory devices as well. For example, there has been known a phenomenon in which e.g., electrons trapped in a floating gate in well-known manner may leak through e.g., an oxide film around the floating gate. Such retention is known to be accelerated e.g., with the temperature. The same may be said of an NROM which is a well-known non-volatile memory employing a nitride. The problem of retention similarly arises in non-volatile semiconductor memory devices of different physical structures exploiting the principle of non-volatility. In short, the refresh function is needed even in non-volatile memories. The technical concept, disclosed by the present invention, is therefore valid not only in volatile semiconductor memory devices but also in non-volatile semiconductor memory devices.

The present invention may be implemented in a variety of semiconductor memory devices. That is, the present invention may be applied to semiconductor products having an information storage function in general. These semiconductor products may be exemplified by a CPU (Central Processing Unit), a MCU (Micro Control Unit), a DSP (Digital Signal Processor), an ASIC (Application Specific Integrated Circuit) and an ASSP (Application Specific Standard Circuit). The present invention may be implemented in a variety of semiconductor memory devices exemplified by a SOC (System-On-Chip), an MCP (Multi-Chip Package) or a POP (Package-On-Package). It is only sufficient that the transistor used in a memory cell or a logic circuit is a FET (Field Effect Transistor). Hence, a variety of FETs, such as MIS (Metal-Insulator Semiconductor) or TFT (Thin-Film Transistor), may be used in addition to the MOS (Metal Oxide Semiconductor) transistor. A fraction of the transistors used may also be other than the FETs. The P-channel transistors or the PMOS transistors that compose a part of a so-called CMOS logic circuit are Exemplary Embodiments of the transistors of the first conductivity type. The N-channel transistors or the NMOS transistors, on the other hand, are Exemplary Embodiments of the transistors of the second conductivity type. The semiconductor substrate may also be an N-type semiconductor substrate, instead of being a P-type semiconductor substrate, or may be a semiconductor substrate of a SOI (Silicon on insulator) structure or other suitable structures.

The entire disclosures of the aforementioned Patent Documents are incorporated by reference herein. The particular exemplary embodiments may be modified or adjusted within the gamut of the entire disclosure of the present invention, inclusive of claims, based on the fundamental technical concept of the invention. Further, variegated combinations or selection of elements disclosed herein may be made within the framework of the claims. That is, the present invention may encompass various modifications or corrections that may occur to those skilled in the art in accordance with and within the gamut of the entire disclosure of the present invention, inclusive of claim and the technical concept of the present invention.

What is claimed is:

1. A semiconductor memory device capable of performing a refresh operation of updating the recorded information to maintain the information; said semiconductor memory device comprising:
    a plurality of memory banks each formed by a recording area constituted by a preset number of bits;
    a command generation circuit that accepts a command from the outside for individually accessing said memory banks; and
    a plurality of refresh control circuits that independently perform said refresh operation on the memory banks basis;
    said refresh control circuits exercising control to enable said refresh operation to be executed based on a first record indicating that said command generation circuit has accessed a relevant one of said memory banks from the outside.

2. The semiconductor memory device according to claim 1, wherein
    a recording operation of said first record is initiated after initialization of said semiconductor memory device.

3. The semiconductor memory device according to claim 1, wherein
    said accessing is a write command that commands writing new information for storage in said memory bank.

4. The semiconductor memory device according to claim 3, wherein
    said first record validates the recording operation of said first record, associated with said write command, based on a second record indicating that said command generation circuit has recognized an active command from the outside that commands reading out the information stored in an associated one of said memory banks to a sense amplifier.

5. The semiconductor memory device according to claim 1, wherein
    each of said refresh control circuits executes said refresh operation by a logic of said first record associated with each of said memory banks and a refresh execution signal for each of said memory banks.

6. The semiconductor memory device according to claim 5, wherein
    said refresh execution signal is generated by an inner address that is necessary to individually refresh said memory banks and that is generated within the semiconductor memory device.

7. The semiconductor memory device according to claim 6, wherein
    said inner address is generated by a refresh request signal issued at a preset period in said semiconductor memory device.

8. The semiconductor memory device according to claim 1, wherein
    said refresh is either self-refresh or auto-refresh.

9. The semiconductor memory device according to claim 1, wherein
    said plurality of memory banks comprise storage areas that are controlled non-exclusively with respect to one another and that each include a plurality of memory elements.

10. A semiconductor memory device capable of performing a refresh operation of updating the recorded information to maintain the information; said semiconductor memory device comprising:
    a plurality of memory banks each formed by a recording area constituted by a preset number of bits;
    a plurality of refresh control circuits that are individually associated with said memory banks and that independently perform said refresh operation on the memory bank basis; and
    a plurality of holding circuits that are individually associated with said memory banks; said holding circuits being reset in case said semiconductor memory device is reset; said holding circuits being set in case data has been written from the outside in associated ones of said memory banks;

said refresh control circuits controlling associated ones of said memory banks to a refresh operation enabling state in case associated ones of said holding circuits are in a set state.

11. The semiconductor memory device according to claim 10, further comprising:
a plurality of write command pulse generation circuits provided in association individually with said multiple memory banks;
said plurality of write command pulse generation circuits each outputting a pulse signal that sets an associated one of said holding circuits in association with a write command from the outside declaring data write in an associated one of said memory banks.

12. The semiconductor memory device according to claim 11, wherein
said plurality of write command pulse generation circuits each output a pulse signal, in synchronism with a first memory bank designation signal generated based on a bank address signal that designates a relevant one of said memory banks; said pulse signal setting said associated one of said holding circuits.

13. The semiconductor memory device according to claim 11, wherein
said write command is entered after a preset time from the delivery of an active command from the outside declaring that an associated one of said memory banks is to be accessed for read or write.

14. The semiconductor memory device according to claim 11, wherein
said write command pulse generation circuit includes a latch circuit:
said latch circuit latching an active signal generated based on activation of said active command in synchronism with a second memory bank designation signal generated based on a bank address signal designating an associated one of said memory banks.

15. The semiconductor memory device according to claim 10, wherein
said refresh is self-refresh or auto-refresh.

16. The semiconductor memory device according to claim 10, wherein
said plurality of memory banks comprise recording areas that each include a plurality of memory elements and that are non-exclusively controlled relative to one another.

17. A semiconductor memory device a recording area of which is formed by a plurality of memory banks and which may be refreshed on a memory bank basis; said semiconductor memory device comprising:
a refresh control circuit and a holding circuit; said refresh control circuit and the holding circuit each being associated with each of said memory banks;
said holding circuit being set if, after resetting said semiconductor memory device, data has been written from the outside in a relevant one of said memory banks;
said refresh control circuit controlling the relevant one of said memory banks to a refresh operation enabling state in case said holding circuit is in a set state.

18. The semiconductor memory device according to claim 17, further comprising:
a write command pulse generation circuit in association with each of said memory banks; said write command pulse generation circuit outputting a pulse signal that sets said holding circuit at the time of activation of a write command following the activation of an active command.

19. The semiconductor memory device according to claim 18, wherein
said write command pulse generation circuit outputs the pulse signal that sets said holding circuit in synchronism with a first memory bank designation signal generated based on a bank address signal.

20. The semiconductor memory device according to claim 18, wherein
said write command pulse generation circuit includes a latch circuit that latches an active signal, generated based on activation of said active command, in synchronism with a second memory bank designation signal generated based on said bank address signal.

* * * * *